US011094570B2

(12) United States Patent
Kagami et al.

(10) Patent No.: US 11,094,570 B2
(45) Date of Patent: Aug. 17, 2021

(54) LOAD PORT HAVING MOVABLE MEMBER THAT ABUTS A PIN

(71) Applicant: HIRATA CORPORATION, Kumamoto (JP)

(72) Inventors: Kinya Kagami, Kumamoto (JP); Seiji Matsuda, Kumamoto (JP)

(73) Assignee: HIRATA CORPORATION, Kumamoto (JP)

( * ) Notice: Subject to any disclaimer, the term of this patent is extended or adjusted under 35 U.S.C. 154(b) by 0 days.

(21) Appl. No.: 16/822,094

(22) Filed: Mar. 18, 2020

(65) Prior Publication Data
US 2020/0312691 A1    Oct. 1, 2020

(30) Foreign Application Priority Data

Mar. 29, 2019  (JP) .............................. JP2019-068531
Mar. 6, 2020   (JP) ................................. 2020-039149

(51) Int. Cl.
*H01L 21/677* (2006.01)
*H01L 21/67* (2006.01)
*H01L 21/687* (2006.01)

(52) U.S. Cl.
CPC .. *H01L 21/67775* (2013.01); *H01L 21/67259* (2013.01); *H01L 21/67766* (2013.01); *H01L 21/67772* (2013.01); *H01L 21/67778* (2013.01); *H01L 21/68707* (2013.01)

(58) Field of Classification Search
None
See application file for complete search history.

(56) References Cited

U.S. PATENT DOCUMENTS 6,896,470 B1 * 5/2005 Chen ................. H01L 21/67772
                                                      414/217
2007/0009345 A1  1/2007 Hall et al.

FOREIGN PATENT DOCUMENTS

| JP | 2002110756 A  |   | 4/2002 |
| JP | 2003142551 A  | * | 5/2003 |
| JP | 3954714 B2    |   | 8/2007 |
| TW | 200733289 A   |   | 9/2007 |

OTHER PUBLICATIONS

Office Action dated May 13, 2021 issued in corresponding Taiwan Patent Application No. 109108769, with English translation (23 pages).

* cited by examiner

*Primary Examiner* — Gerald McClain
(74) *Attorney, Agent, or Firm* — Buchanan Ingersoll & Rooney PC

(57) ABSTRACT

A load port includes a first pin projecting on a dock plate and provided on the dock plate so as to be pushed down, and a first detection unit provided on the base portion and configured to detect that the dock plate is located at a first position. The first detection unit includes a movable member capable of displacing in a moving direction of the dock plate, and a first sensor configured to detect the displacement of the movable member. The movable member is arranged at a position to abut against the first pin that is in a pushed down state in a process in which the dock plate moves from a second position to the first position.

7 Claims, 17 Drawing Sheets

LOAD PORT HAVING MOVABLE MEMBER THAT ABUTS A PIN

CROSS-REFERENCE TO RELATED APPLICATION(S)

This application claims priority to and the benefit of Japanese Patent Application No. 2019-068531 filed on Mar. 29, 2019 and Japanese Patent Application No. 2020-039149 filed on Mar. 6, 2020, the entire disclosures of which are incorporated herein by reference.

BACKGROUND OF THE INVENTION

Field of the Invention

The present invention relates to a load port.

Description of the Related Art

A container such as a FOUP, which stores a substrate such as a semiconductor wafer, is known. Such a container is opened/closed in a load port provided in a processing facility to take in or out the substrate in the container. The load port is provided with a dock plate on which the container is placed, and a mechanism configured to move the dock plate. The dock plate on which the container is placed is moved to a predetermined position, thereby opening/closing the container.

The load port is connected and attached to a substrate conveying apparatus incorporating a substrate conveying robot configured to convey a substrate. The load port includes a port plate that partitions between a working space in the substrate conveying apparatus and the outside. An opening portion formed in the port plate can freely be opened/closed by a port door. If the opening portion is unintentionally opened in a state in which the FOUP is not docked with the opening portion of the port plate, the working space is exposed to the outside. In this case, a foreign object may undesirably be caught between the port plate and the port door during movement of the port door. It is also necessary to avoid projection of a part of the substrate conveying robot from the opening portion when it operates.

Japanese Patent Laid-Open No. 2002-110756 discloses a load port in which a double structure including a door configured to open/close the opening portion of a port plate and another door is employed, and the doors are prevented from opening simultaneously. In addition, Japanese Patent No. 3954714 discloses a load port that opens an opening portion of a port plate on condition that it is detected that a cassette is placed on the load port.

Hence, it is necessary to reliably prevent unintended driving of the load port and the substrate conveying robot (substrate conveying apparatus) to ensure safety on the periphery. To ensure safety on the periphery, a method is considered to be used in which the states of portions of the load port are detected by a plurality of sensors, and only when the detection results satisfy predetermined conditions, driving of the port door and the substrate conveying robot is permitted. However, an increase in the number of sensors leads to an increase in the cost.

SUMMARY OF THE INVENTION

It is an object of the present invention to provide a load port including a mechanism configured to detect that a container is present on a dock plate and that the dock plate is located at a dock position.

According to an aspect of the present invention, there is provided a load port comprising: a port plate including an opening portion through which it is possible to take in and out a substrate; a placing table on which a container that stores the substrate is placed; a port door capable of opening/closing the opening portion and holding a door portion of the container; and a driving mechanism configured to perform an opening/closing operation of the port door, wherein the placing table comprises: a base portion; a dock plate on which the container is placed; a moving mechanism provided on the base portion and configured to support the dock plate and move the dock plate between a first position close to a side of the port plate where the port door can hold the door portion and a second position apart from the port plate; a first pin projecting on the dock plate and provided on the dock plate so as to be pushed down; and a first detection unit provided on the base portion and configured to detect that the dock plate is located at the first position, the first detection unit comprises: a movable member capable of displacing, with respect to the base portion, in a moving direction of the dock plate by the moving mechanism; and a first sensor configured to detect the displacement of the movable member, and the movable member is arranged at a position to abut against the first pin that is in a pushed down state in a process in which the dock plate moves from the second position to the first position.

According to another aspect of the present invention, there is provided a load port comprising: a port plate including an opening portion through which it is possible to take in and out a substrate; a placing table on which a container that stores the substrate is placed; a port door capable of opening/closing the opening portion and holding a door portion of the container; and a driving mechanism configured to perform an opening/closing operation of the port door, wherein the placing table comprises: a base portion; a dock plate on which the container is placed; a moving mechanism provided on the base portion and configured to support the dock plate and move the dock plate between a first position close to a side of the port plate where the port door can hold the door portion and a second position apart from the port plate; a first pin projecting on the dock plate and provided on the dock plate so as to be pushed down; and a first detection unit provided on the base portion and configured to detect that the dock plate is located at the first position, and the first detection unit comprises a non-contact sensor which detects the first pin that is in a pushed down state in a process in which the dock plate moves from the second position to the first position.

Further features of the present invention will become apparent from the following description of exemplary embodiments (with reference to the attached drawings).

DESCRIPTION OF THE EMBODIMENTS

Figure 1:
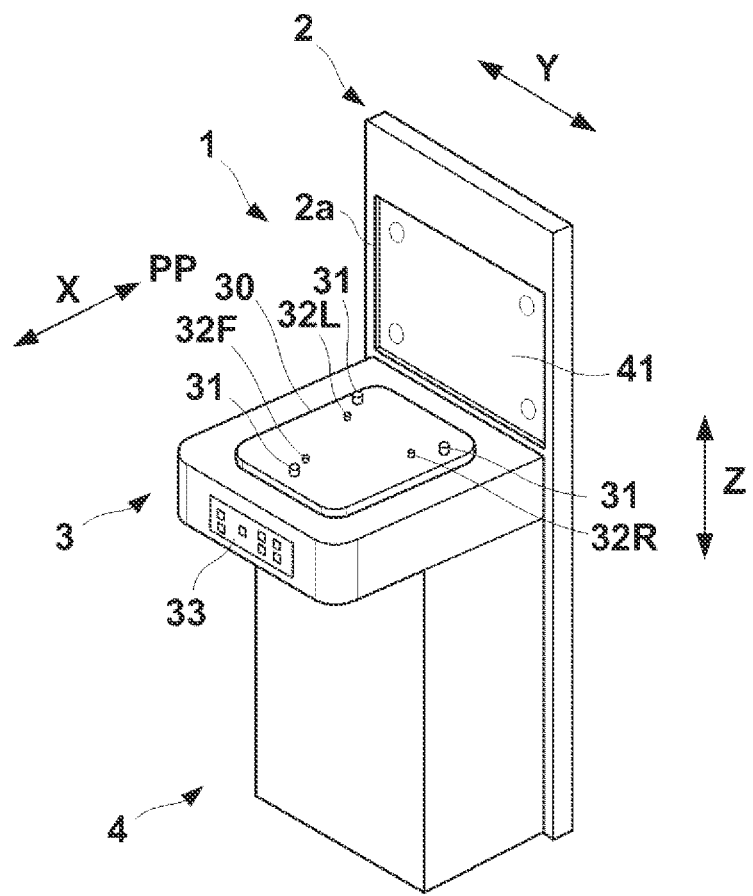
FIG. 1 is a view showing the outer appearance of a load port according to an embodiment of the present invention.

Hereinafter, embodiments will be described in detail with reference to the attached drawings. Note that the following embodiments are not intended to limit the scope of the claimed invention, and limitation is not made an invention that requires all combinations of features described in the embodiments. Two or more of the multiple features described in the embodiments may be combined as appropriate. Furthermore, the same reference numerals are given to the same or similar configurations, and redundant description thereof is omitted.

First Embodiment

Outline of Apparatus

Figure 2:
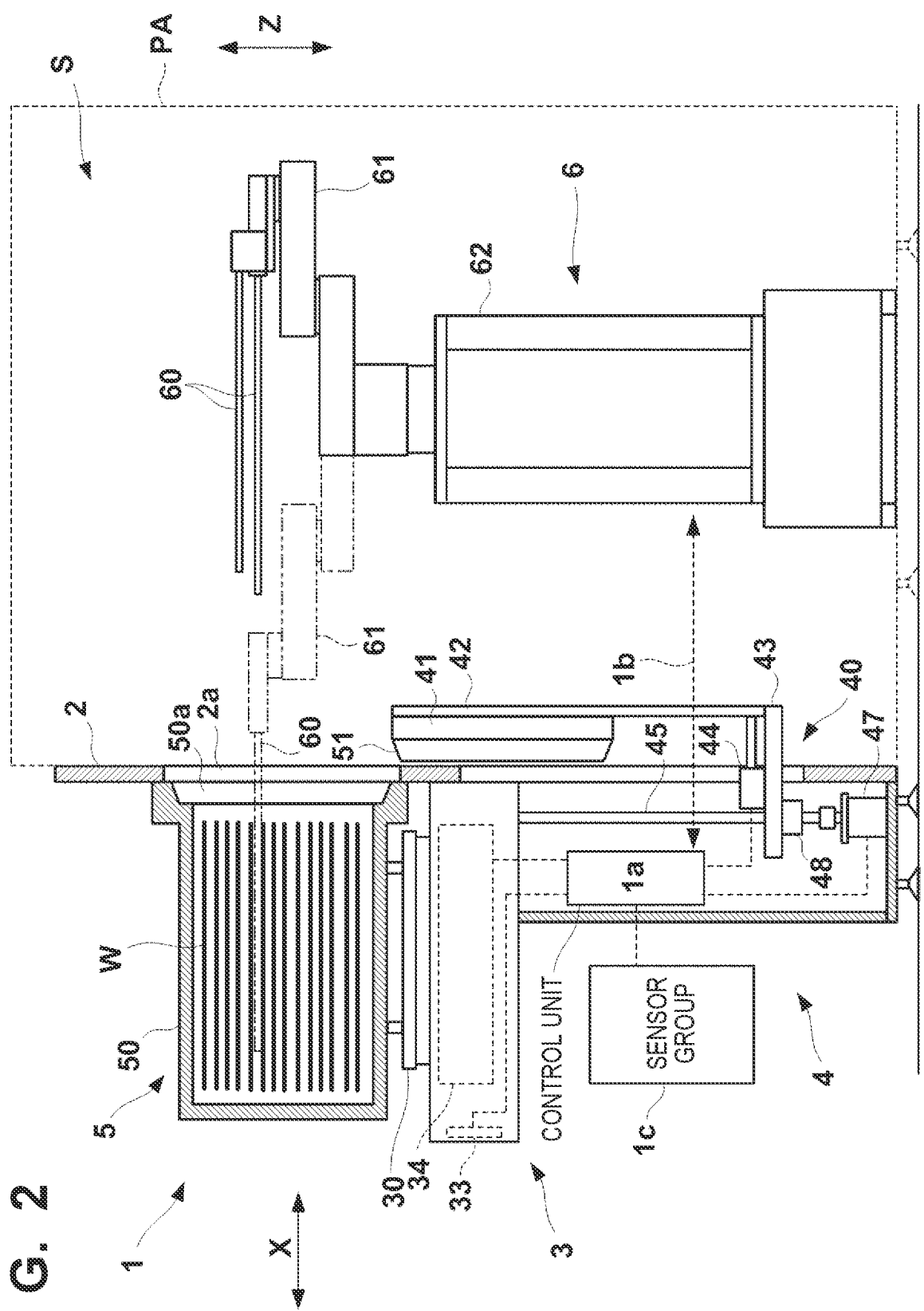
FIG. 2 is a view showing the internal mechanism and a use example of the load port shown in FIG. 1.

FIG. 1 is a view showing the outer appearance of a load port 1 according to an embodiment of the present invention. FIG. 2 is a view showing the internal mechanism and a use example of the load port 1. In the drawings, arrows X and Y indicate horizontal directions orthogonal to each other, and an arrow Z indicates a vertical direction. In addition, of the X directions, PP represents the side of a port plate 2. The meanings of these arrows also apply to other drawings as well.

The load port 1 is an apparatus that opens/closes a container 5 such as a FOUP. The container 5 includes a box-shaped container main body 50 having, in a side portion, an opening portion 50a used to take in or out a substrate W such as a semiconductor wafer, and a lid (door) 51 that is detachably attached to the opening portion 50a and closes the opening portion 50a. Note that FIG. 2 shows a state (open state) in which the lid 51 is removed by the load port 1, and a substrate conveying robot 6 can access the substrate W in the container 5.

The load port 1 includes the port plate 2, a placing table 3 on which the container 5 is placed, and a support portion 4 that supports the placing table 3. The port plate 2 is a plate-shaped body extending in the Z direction. The port plate 2 includes an opening portion 2a through which the removed lid 51 can pass in the X direction. At least one load port 1 is attached to a substrate conveying apparatus PA incorporating the substrate conveying robot 6 that conveys the substrate W. The substrate conveying robot 6 performs unloading and loading of the substrate W from and into the container 5 on the load port 1. The substrate conveying robot 6 includes an end effector 60 that holds the substrate W, an articulated arm 61 that holds the end effector 60 such that it can at least freely move forward and backward, and a driving unit 62 that makes the articulated arm 61 move forward/backward, turn, and move upward/downward. In the above-described open state, when the substrate conveying robot 6 is made to enter the container main body 50 communicating with the substrate conveying apparatus (substrate conveying module) PA, unloading and loading of the substrate W are performed.

The placing table 3 includes a dock plate 30 on which the container 5 is placed. The dock plate 30 is provided with a plurality of positioning pins 31 that support the container 5 while positioning it, and a plurality of detection pins 32F, 32L, and 32R configured to detect the presence of the container 5. The placing table 3 incorporates a driving mechanism 34 that displaces the dock plate 30 in the X direction. In addition, the placing table 3 includes an operation panel 33 on the front surface. An operator can do settings of the load port 1 and operation instructions via the operation panel 33.

The support portion 4 is a hollow body having a rectangular parallelepiped shape. The support portion 4 is provided with a driving mechanism 40. The driving mechanism 40 performs an opening/closing operation of a port door 41. The port door 41 opens/closes the opening portion 2a and also holds the lid 51 of the container 5 and performs an opening/closing operation of the container 5. The driving mechanism 40 includes a mechanism configured to move the port door 41 that holds the lid 51 between a close position where the lid 51 closes the opening portion 50a, a retreat position where the lid 51 retreats through the opening portion 2a, and an open position (the position in the open state shown in FIG. 2) where the lid 51 retreats to the lower side of the lower edge of the opening portion 2a. The port door 41 includes, for example, a chucking mechanism, and the port door 41 can thus chuck and hold the lid 51. In addition, the port door 41 is provided with an operation mechanism (latch key) that operates opening/closing of a lock mechanism included in the lid 51. This can detach and attach the lid 51 from and to the container main body 50.

The driving mechanism 40 has the following arrangement. That is, the port door 41 is supported by a connecting member 42 extending in the Z direction. The connecting member 42 is supported by a stage member 43 to be slidable in the X direction, and is moved in the X direction by an actuator 44 such as a ball screw or an electric cylinder. In addition, a ball nut 48 engaging with a ball screw shaft 45 extending in the vertical direction is fixed to the stage member 43. When the ball screw shaft 45 is rotated by a motor 47, the port door 41, the connecting member 42, and the stage member 43 integrally move upward or downward.

With the above-described structure, the driving mechanism 40 can move the port door 41 in the X direction and the Z direction. Hence, the lid 51 is moved between the close position, the retreat position, and the open position. Note that the mechanism that moves the port door 41 is not limited to this, and various mechanisms can be employed.

The load port 1 is provided with a control unit 1a. The control unit 1a includes, for example, a processing unit represented by a CPU, storage units such as a RAM and a ROM, an input/output interface between an external device and the processing unit, and a communication interface that performs communication with a computer such as a host computer or a peripheral device (the substrate conveying apparatus PA, the substrate conveying robot 6, or the like) via a communication line 1b. The driving mechanism 34, the actuator 44, and the motor 47 are controlled by the control unit 1a. In addition, the detection result of each sensor included in a sensor group 1c or an operation of the operator via the operation panel 33 is recognized by the control unit 1a. The sensor group 1c includes sensors 10a, 11a, and 90, and the like to be described later.

Displacement Mode of Dock Plate

Figure 3A:
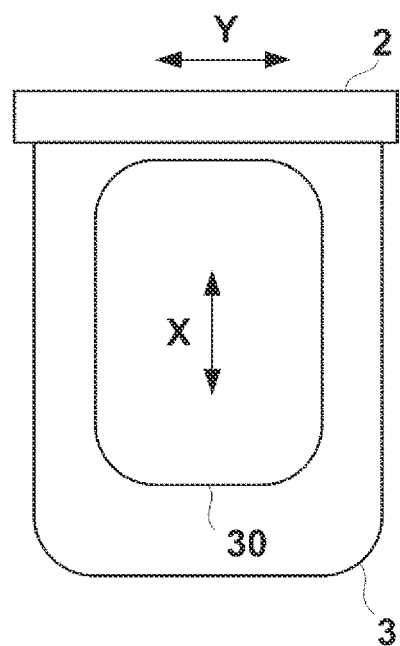
FIGS. 3A and 3B are views showing the displacement mode of the dock plate.
Figure 3B:
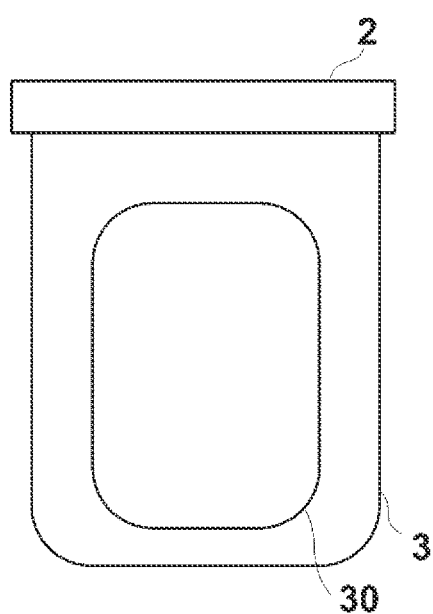

FIGS. 3A and 3B are views showing the displacement mode of the dock plate 30, and are plan views of the load port 1. In this embodiment, the driving mechanism 34 can move the dock plate 30 in the X direction.

FIG. 3A shows a state in which the dock plate 30 is located at a position (to be also referred to as dock position hereinafter) closest to the PP side in the X direction with respect to the port plate 2. Opening/closing of the container 5 is performed at the dock position. FIG. 3B shows a state in which the dock plate 30 is located at a position (to be also referred to as a transfer position hereinafter) farthest from the port plate 2. Loading of the container 5 onto the dock plate 30 and unloading of the container 5 from the dock plate 30 are performed at the transfer position.

Structure of Moving Mechanism

Figure 4:
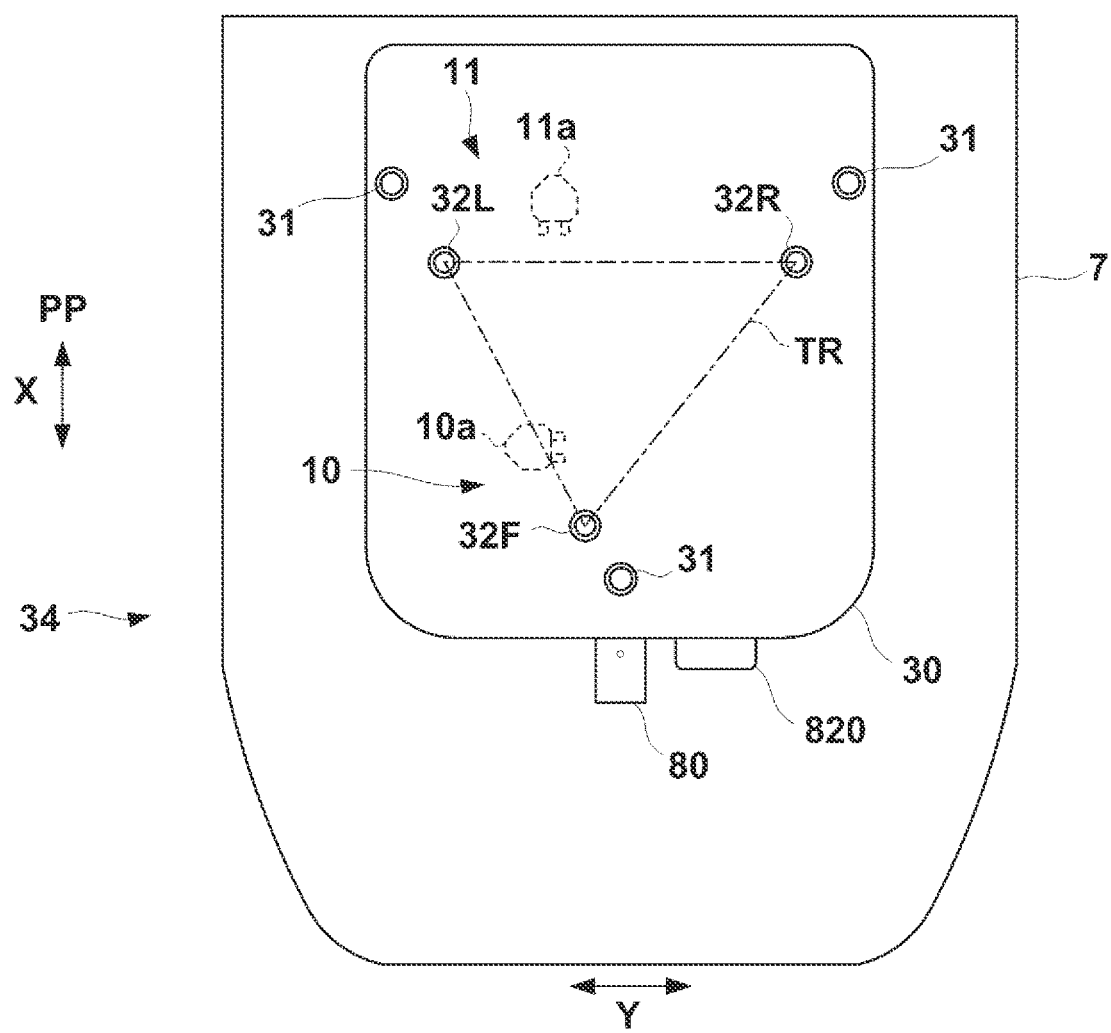
FIG. 4 is an explanatory view of a pin arrangement on a dock plate.
Figure 5:
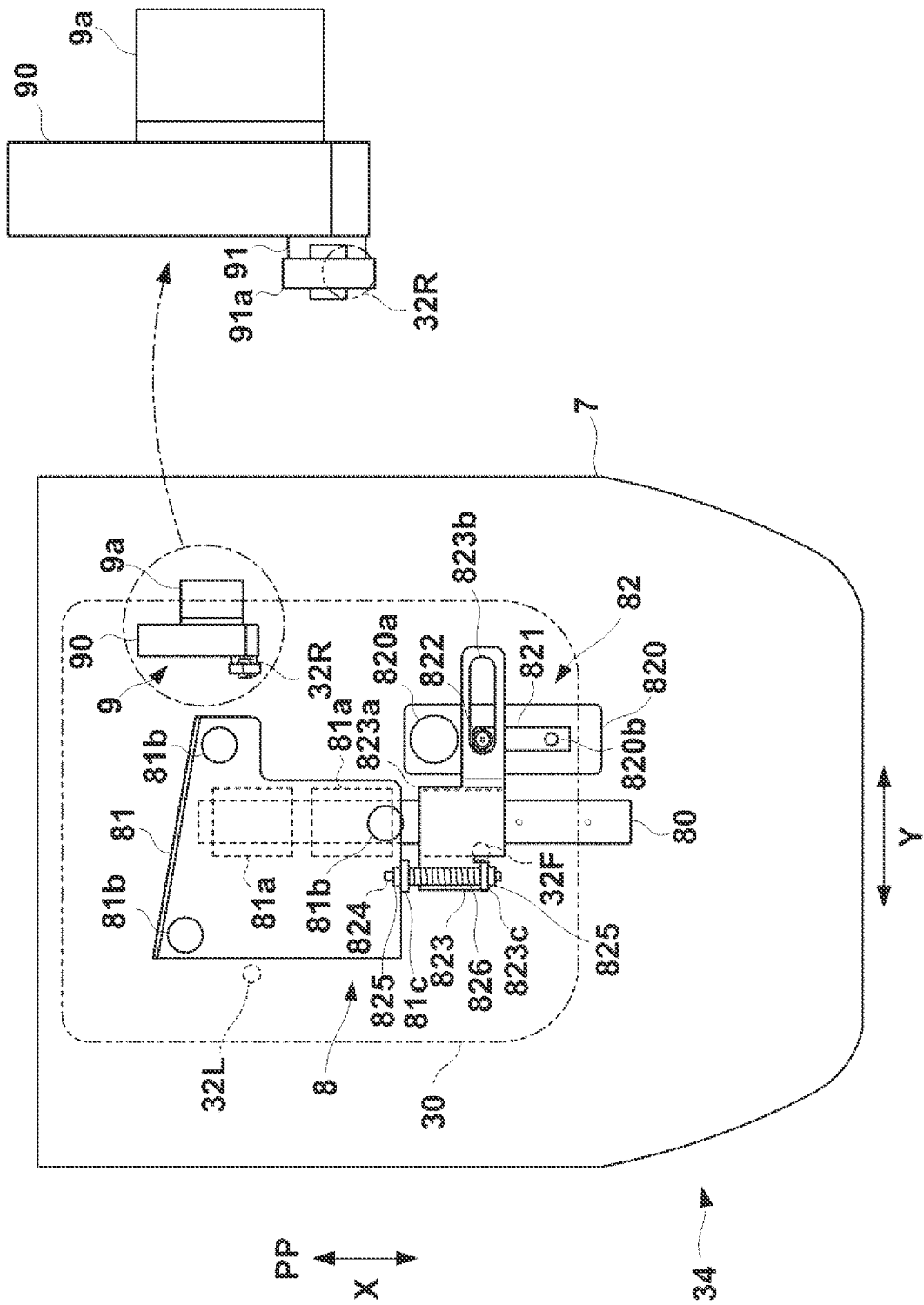
FIG. 5 is an explanatory view of the moving mechanism and the like of the dock plate.
Figure 6:
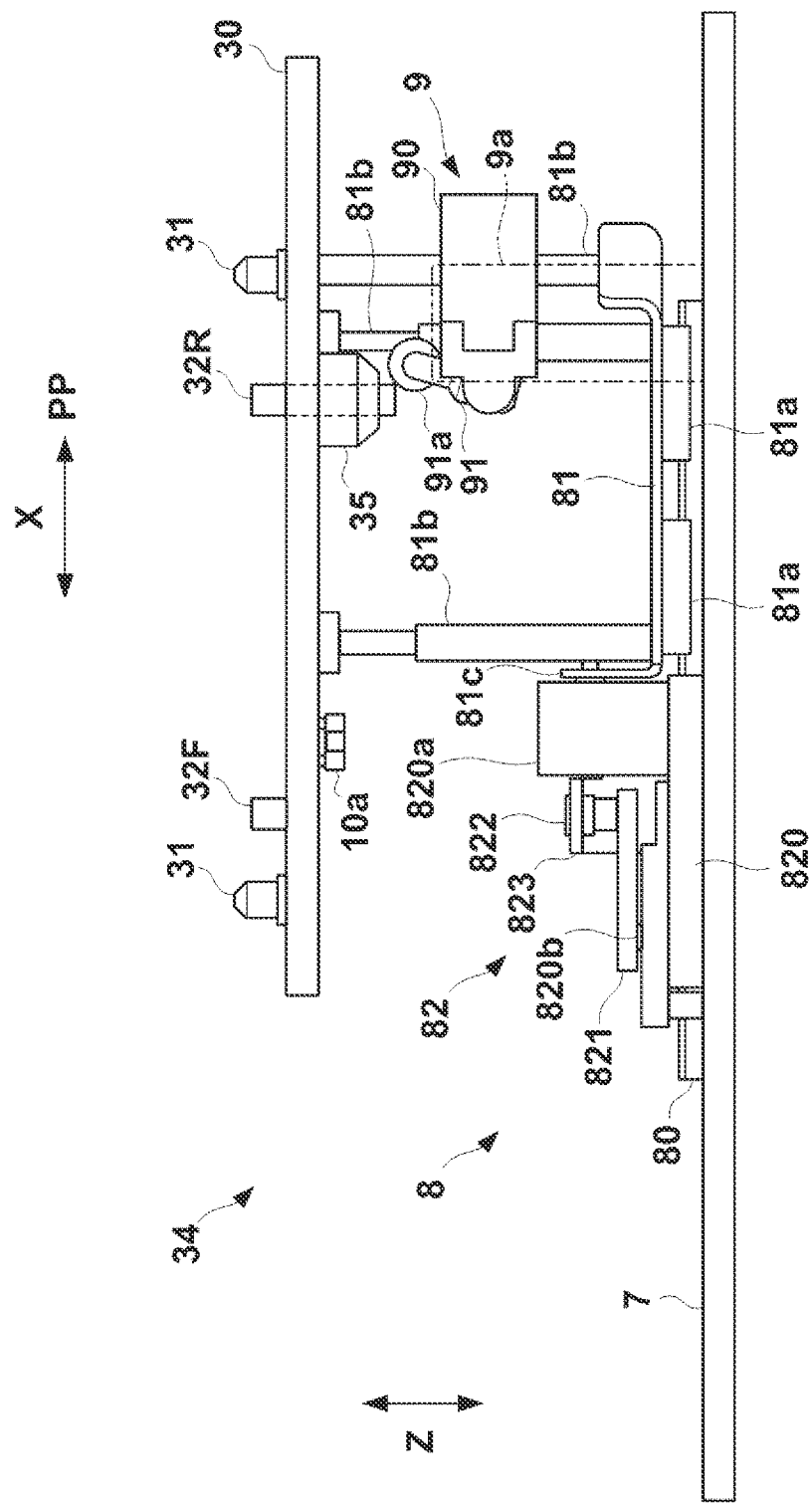
FIG. 6 is an explanatory view of the moving mechanism and the like of the dock plate.

The structure of the driving mechanism 34 will be described. FIG. 4 is a plan view of the dock plate 30 and the driving mechanism 34. FIG. 5 is a plan view of the driving mechanism 34 seen through the dock plate 30. FIG. 6 is a right side view of the driving mechanism 34. All the drawings show a state in which the dock plate 30 is located at the dock position.

The driving mechanism 34 includes a base portion 7 and a moving mechanism 8. The base portion 7 is a support body for the entire driving mechanism 34, and is a plate-shaped member in this embodiment.

The moving mechanism 8 is arranged between the base portion 7 and the dock plate 30. The moving mechanism 8 includes a rail member 80, and a slider 81 that moves on the rail member 80. At the center of the base portion 7 in the Y direction, the rail member 80 is extended in the X direction and fixed to the base portion 7. The slider 81 supports the dock plate 30 via a plurality of columns 81b and moves together with the dock plate 30. The moving range of the slider 81 corresponds to the range between the dock position and the transfer position, which is the moving range of the dock plate 30 in the X direction. The slider 81 engages with the rail member 80 and is fixed on a plurality of engaging members 81a that slide along the rail member 80.

The moving mechanism 8 includes a driving mechanism 82. The driving mechanism 82 is a mechanism that moves the slider 81 in the X direction. The driving mechanism 82 includes a driving unit 820. The driving unit 820 includes a motor 820a as a driving source, and the driving force of the motor 820a is transmitted to an output shaft 820b via transmission mechanisms (a gear mechanism, a belt transmission mechanism, and the like) in the driving unit 820. The output shaft 820b rotates about an axis in the Z direction. One end portion of an arm member 821 is fixed to the output shaft 820b. A cam follower 822 is provided at the other end portion of the arm member 821. As the output shaft 820b rotates, the arm member 821 pivots on the X-Y plane.

The moving mechanism 8 includes a cam plate 823. The cam plate 823 is fixed on an engaging member 823a that engages with the rail member 80 and slides along the rail member 80. The cam plate 823 includes a cam groove 823b. The cam groove 823b is a through hole extended in the Y direction. The cam follower 822 engages with the cam groove 823b. When the cam follower 822 moves on an arc trajectory with respect to the output shaft 820b as the center in accordance with the pivotal movement of the arm member 821, the cam plate 823 moves in the X direction.

The cam plate 823 includes a connecting portion 823c, and the slider 81 includes a connecting portion 81c. The connecting portions 823c and 81c are portions that connect the cam plate 823 and the slider 81. The cam plate 823 and the slider 81 may rigidly be connected. In this embodiment, however, an elastic member 826 is interposed between the cam plate 823 and the slider 81, and the elastic member 826 buffers driving force transmission between them. That is, the cam plate 823 and the slider 81 can displace relative to each other in the X direction. Hence, for example, even if a foreign object is caught between the port plate 2 and the container 5 when moving the cam plate 823 to the dock position, the elastic member elastically deforms so that only a load of a predetermined value or less that never injures the operator is applied. Additionally, at this time, the container 5, the cam plate 823, and the slider 81 cannot displace in a direction to move close to the port plate 2 anymore. As a result, operation safety can be ensured.

The elastic member 826 may be rubber or the like, and is a coil spring in this embodiment. A rod 824 is inserted into the connecting portions 823c and 81c and the elastic member 826. Each of the connecting portions 823c and 81c is a vertical wall standing in the Z direction, and includes a hole in which the rod 824 is inserted. A stopper 825 is provided at each end portion of the rod 824. The elastic member 826 generates a biasing force in a direction in which the connecting portions 823c and 81c separate, and the connecting portions 823c and 81c can move close to or apart from each other within the range of the two stoppers 825. That is, the cam plate 823 and the slider 81 can move close to or apart from each other within the range of the two stoppers 825. They are normally apart by the distance between the two stoppers 825 because of the biasing force of the elastic member 826, and can move close to each other only when some external load acts.

The dock plate 30 is provided with the three detection pins 32F, 32L, and 32R. The detection pins 32F, 32L, and 32R are presence sensors configured to detect whether the container 5 is present (placed) on the dock plate 30. When the container 5 is appropriately placed on the dock plate 30, all the detection pins 32F, 32L, and 32R are pushed down. The detection pins 32F, 32L, and 32R are arranged to be located at the vertices of an acute triangle in a planar view of the dock plate 30 (FIG. 4). If the container 5 is inappropriately placed in a tilting state or placed at a deviated position, at least one of the detection pins 32F, 32L, and 32R is not pushed down to a position where the detection pin is detected by a sensor to be described later.

The sensor 10a that detects the push-down of the detection pin 32F is provided on the lower surface of the dock plate 30. The detection pin 32F and the sensor 10a form a detection unit 10 configured to detect whether the container 5 is placed. Details of the detection unit 10 will be described later with reference to FIGS. 7A to 7C. A sensor 11a that detects the push-down of the detection pin 32L is provided on the lower surface of the dock plate 30. The detection pin 32L and the sensor 11a form a detection unit 11 configured to detect whether the container 5 is placed. The arrangement of the detection unit 11 is the same as the detection unit 10. The push-down of the detection pin 32R is detected by a detection unit 9. The detection unit 9 is fixed to the base portion 7 by a bracket 9a. Details of the detection unit 9 will be described with reference to FIGS. 9A to 10D.

Figure 7A:
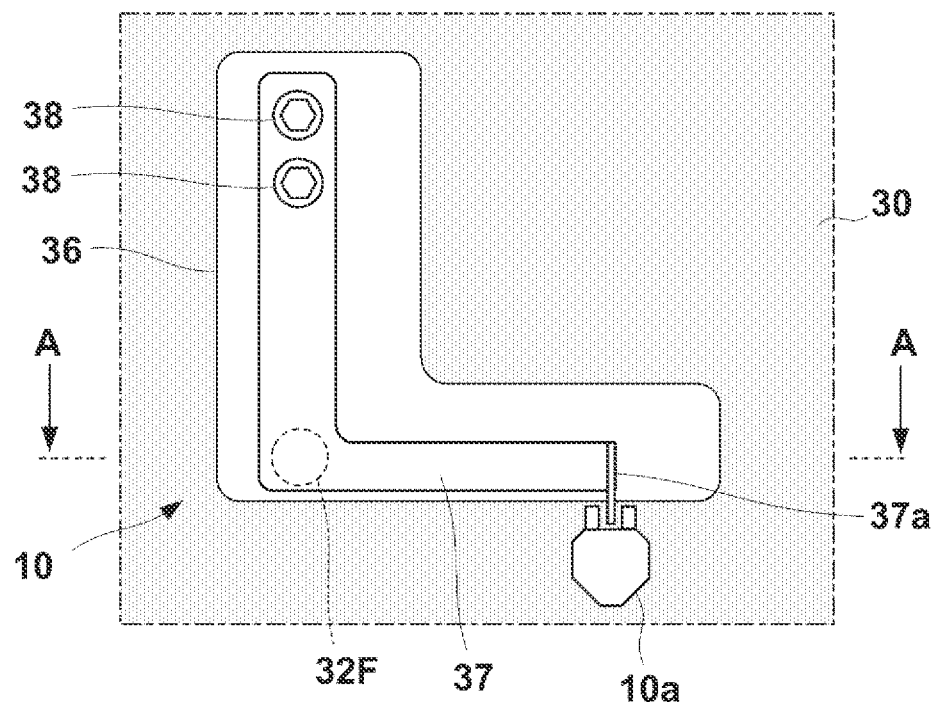
FIG. 7A is an explanatory view of a detection unit.
Figure 7B:
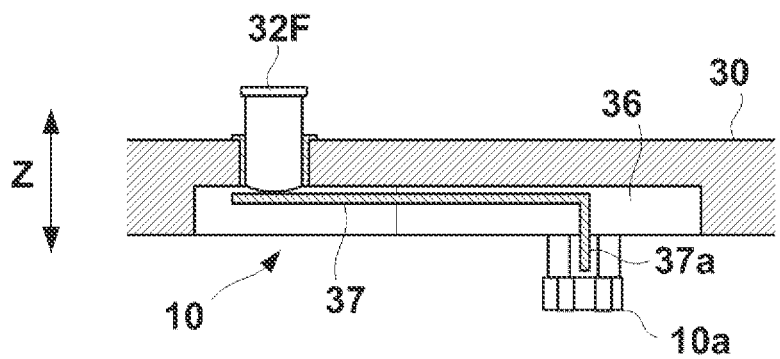
FIG. 7B is a sectional view taken along a line A-A in FIG. 7A.

The arrangement of the detection unit 10 will be described with reference to FIGS. 7A to 7C. FIG. 7A is a bottom view of the dock plate 30 near the detection pin 32F, and FIG. 7B is a sectional view taken along a line A-A in FIG. 7A. An L-shaped concave portion 36 is formed in the lower surface of the dock plate 30, and the detection pin 32F extends through the dock plate 30 in the concave portion 36. An L-shaped leaf spring 37 is arranged in the concave portion 36, and only one end portion of the leaf spring 37 is fixed to the dock plate 30 by bolts 38. That is, the leaf spring 37 is cantilever-supported. The lower end of the detection pin 32F abuts against a middle portion of the leaf spring 37 (in this embodiment, the bending portion of the leaf spring 37). The leaf spring 37 functions as a return spring that biases the detection pin 32F upward.

The other end portion of the leaf spring 37 is bent, and a sensor dog 37a is formed. The sensor 10a is a photo interrupter and detects that the sensor dog 37a is present between a light-receiving element and a light-emitting element. Note that as the sensor 10a, a sensor (for example, a microswitch sensor including a lever-shaped actuator) other than a photo interrupter can also be employed. In addition, a structure that does not use the leaf spring 37 can also be employed, and a photo interrupter and a microswitch sensor may be used together.

Figure 7C:
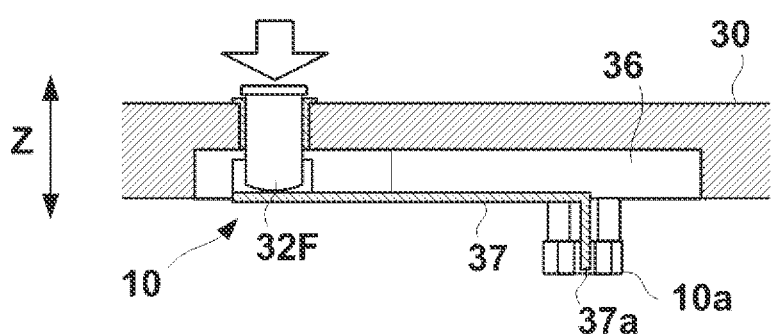
FIG. 7C is an explanatory view of the operation of the detection unit.

FIG. 7C shows a state in which the detection pin 32F is pushed down. When the container 5 is appropriately placed on the dock plate 30, the detection pin 32F is pushed down by the weight of the container 5, as shown in FIG. 7C. Hence, the leaf spring 37 is also pushed down, the sensor dog 37a enters between the light-receiving element and the light-emitting element, and the sensor 10a detects this. When the container 5 is unloaded from the dock plate 30, the detection pin 32F is returned to the position shown in FIG. 7B by the elastic biasing force of the leaf spring 37.

Figure 8A:
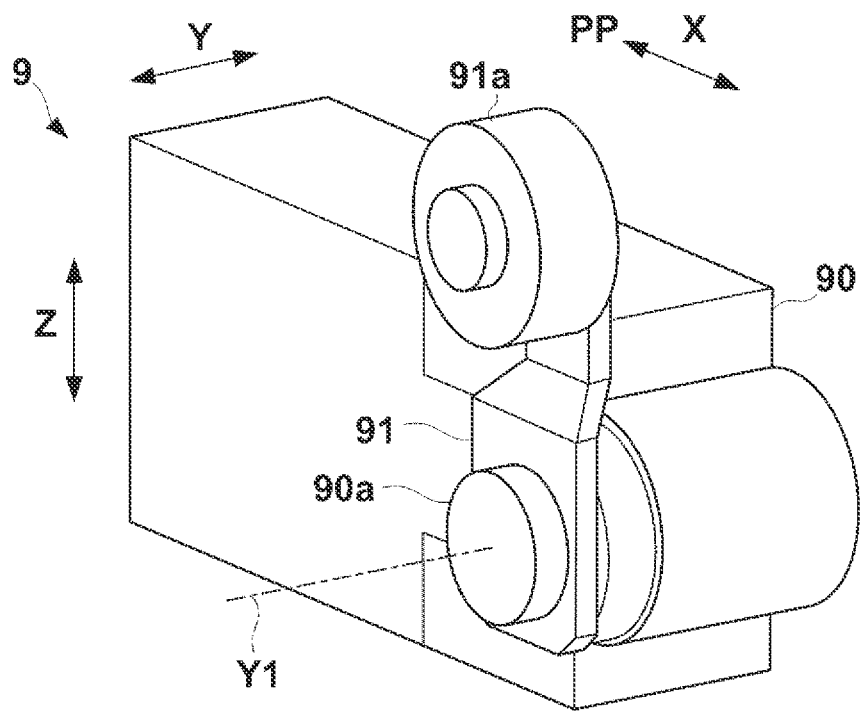
FIG. 8A is a perspective view of the detection unit.

The detection unit 9 will be described with reference to FIG. 8A. The detection unit 9 includes the sensor 90 and a movable member 91, and functions as a safety mechanism or a safety component configured to prevent an unintended operation of the load port 1 or the substrate conveying robot 6.

In this embodiment, the sensor 90 is a rotary limit switch. The sensor 90 incorporates a microswitch, and an electric circuit is opened/closed (an electric contact is turned on/off) by the switch mechanism of the microswitch. When an external force is applied to the movable member 91, and an input shaft 90a rotates by a predetermined angle about a rotation center line Y1 parallel to the predetermined Y direction, the microswitch is biased and turned on by a cam mechanism formed on the input shaft 90a and a plunger that abuts against the cam mechanism and is movable in the X direction. The sensor 90 incorporates an elastic member that biases the input shaft 90a to the OFF position via the plunger. For this reason, when the external force applied to the movable member 91 is removed, the input shaft 90a returns to the OFF position that is the initial position.

The movable member 91 is a lever member that has one end portion fixed to the input shaft 90a and can pivot about the rotation center line Y1. The movable member 91 includes a roller portion 91a rotatably provided at the other end portion. When an external force is applied to the movable member 91, and the movable member 91 displaces (tilts) by a predetermined amount or more to the PP side in the X direction, the sensor 90 is turned on. The detection unit 9 is attached to the base portion 7 or the like such that the position of the roller portion 91a in the Y direction becomes the same as the position of the detection pin 32R in the Y direction. Note that as the movable member 91, a structure that does not include the roller portion 91a can also be employed.

Figure 8B:
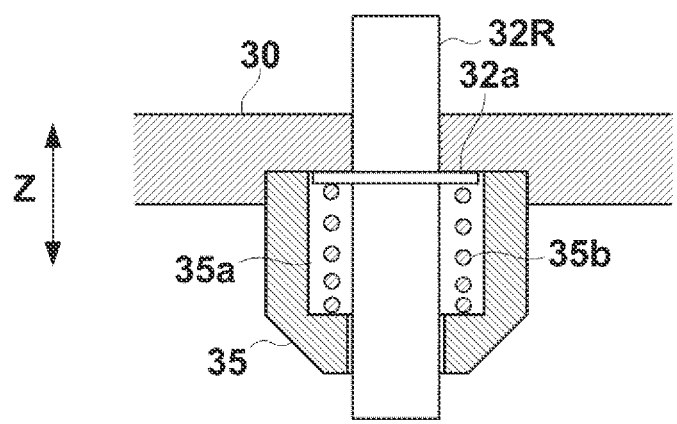
FIG. 8B is a sectional view of a pin support portion.

FIG. 8B is a sectional view showing the support structure of the detection pin 32R. The detection pin 32R is a pin whose length in the axial direction is long, unlike the remaining detection pins 32F and 32L. A tubular support portion 35 that supports the detection pin 32R is fixed to the dock plate 30. An elastic member 35b is arranged in an internal space 35a of the support portion 35. In this embodiment, the elastic member 35b is a coil spring mounted on the detection pin 32R. The detection pin 32R extends through the dock plate 30 and the support portion 35. In addition, a stopper 32a is fixed to the detection pin 32R. The stopper 32a is always biased upward by the elastic member 35b.

Figure 9A:
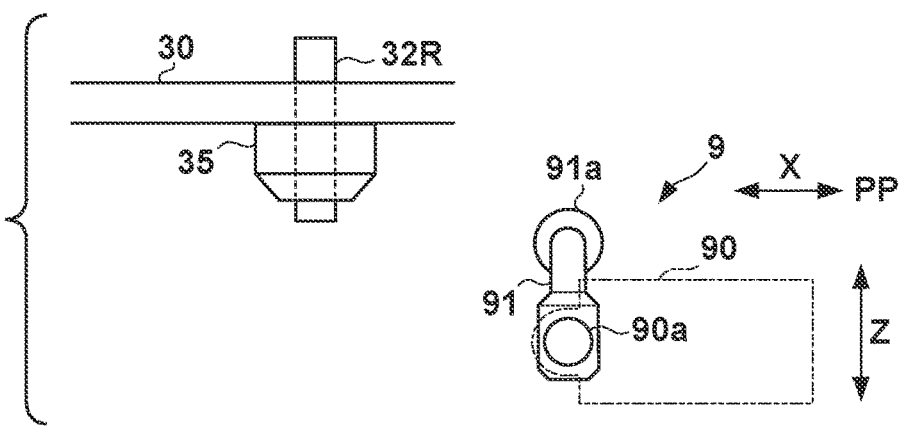
FIGS. 9A to 9D are explanatory views of the operation of the detection unit shown in FIG. 8A.
Figure 9B:
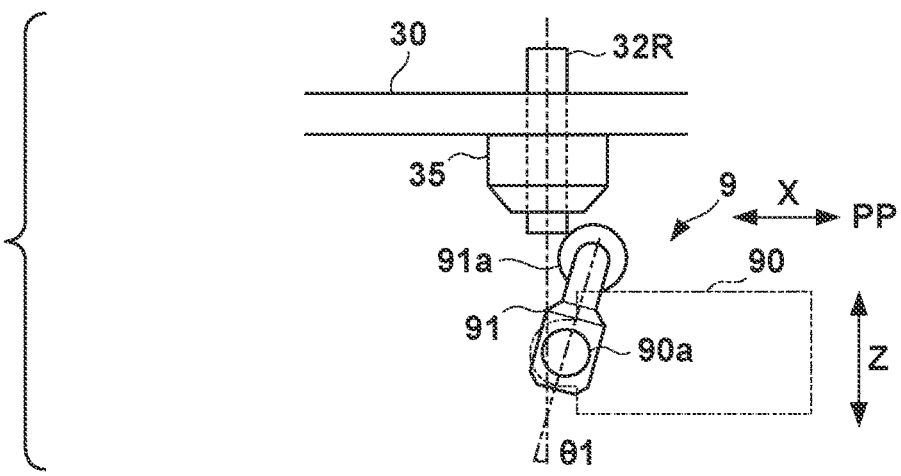
Figure 9C:
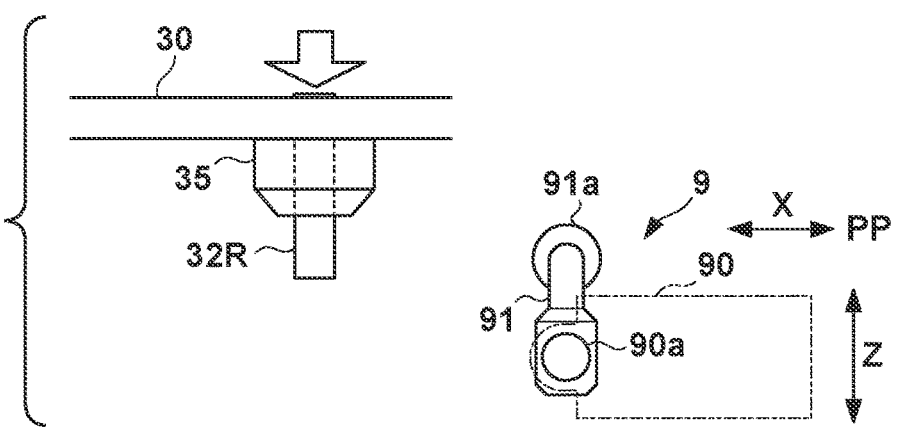
Figure 9D:
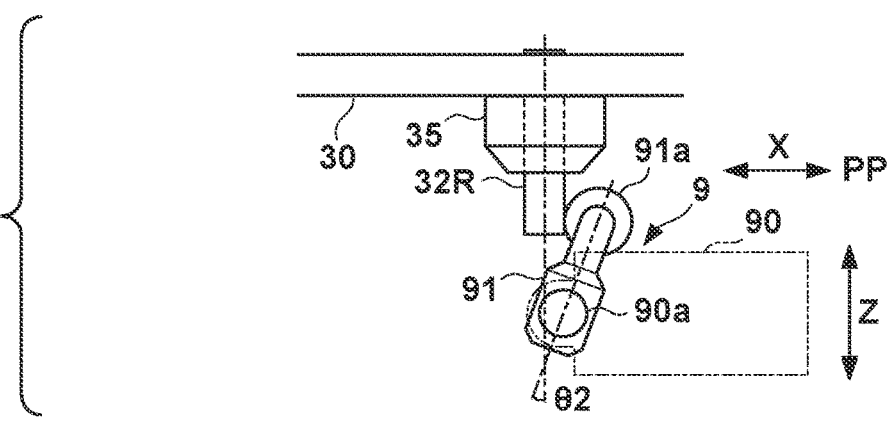

FIGS. 9A to 9D are explanatory views of the operation of the detection pin 32R and the detection unit 9. As shown in FIG. 9D, the roller portion 91a is arranged to abut against the detection pin 32R that is pushed down. In this embodiment, the roller portion 91a is arranged to abut against even the detection pin 32R that is not pushed down, as shown in FIG. 9B. However, since the abutment portion is different, the displacement amount (tilt angle) of the movable member 91 is different.

FIG. 9A shows a state in which the dock plate 30 is located at the transfer position. The container 5 is not present (not placed) on the dock plate 30, and the detection pin 32R is located at the initial position by the biasing of the above-described elastic member 35b. The movable member 91 is located at the initial position. FIG. 9B shows a state in which the dock plate 30 has moved from the state in FIG. 9A to the dock position. The container 5 is not placed on the dock plate 30, and the detection pin 32R is still located at the initial position by the biasing of the above-described elastic member 35b. When the detection pin 32R abuts against the roller portion 91a, the movable member 91 slightly tilts from the initial position to the side of the port plate 2 in the X direction. Since the lower end of the detection pin 32R lightly abuts against the upper side of the center of the roller portion 91a, the movable member 91 does not tilt greatly, and a tilt angle θ1 is small. At this time, the sensor 90 of the movable member 91 is not turned on and remains off.

FIG. 9C shows a state in which the dock plate 30 is located at the transfer position. FIG. 9C assumes a state in which the container 5 is appropriately present on the dock plate 30. The detection pin 32R is pushed down by the weight of the container 5, and the projecting amount downward from the support portion 35 is large. FIG. 9D shows a state in which the dock plate 30 has moved from the state in FIG. 9C to the dock position. When the detection pin 32R abuts against the roller portion 91a, the movable member 91 tilts from the initial position to the side of the port plate 2 in the X direction. Since the detection pin 32R deeply abuts against the roller portion 91a at the same height as the center of the roller portion 91a, a tilt angle θ2 (>θ1) of the movable member 91 is large. At this time, the sensor 90 of the movable member 91 is turned on.

As described above, according to the detection unit 9 of this embodiment, it is possible to detect not only whether the container 5 is present (appropriately placed) on the dock plate 30 but also whether the container 5 is present on the dock plate 30, and the dock plate 30 is located at the dock position. Since the two states can be detected by one detection unit 9, the placement of the container 5 on the dock plate 30 and the position of the dock plate 30 can be detected at a relatively low cost.

The detection unit 9 is arranged in correspondence with the detection pin 32R. The detection pin 32R is one of the two detection pins 32L and 32R that are arranged on the side of the port plate 2 in the three detection pins 32F, 32L, and 32R and spaced part in the Y direction crossing the moving direction of the dock plate 30. The detection pin 32R is arranged at a position to easily detect a container that is placed in a tilting state on the dock plate 30. Hence, when the detection pin 32R is detected by the detection unit 9, the reliability of placement detection of the container 5 can be increased.

Additionally, since the detection unit 9 detects the detection pin 32R arranged at a position close to one end side of the dock plate 30 in the Y direction, the detection unit 9 can be arranged at a position close to one end side on the base portion 7 in the Y direction. On one end side of the base portion 7 in the Y direction, a free space where other mechanisms exist relatively little is formed, and the detection unit 9 can be arranged in the free space. The detection unit 9 may be arranged in correspondence with the detection pin 32L, or may be arranged in correspondence with the detection pin 32F, as a matter of course.

Note that in this embodiment, the sensor 90 is not turned on in the state shown in FIG. 9B. As the sensor 90, a sensor that includes a plurality of ON contacts and is selectively turned on between the state shown in FIG. 9B and the state shown in FIG. 9D may be used. In the state shown in FIG. 9B, in a state in which the container 5 is not placed on the dock plate 30, the control unit 1a can recognize that the dock plate 30 has been moved to the dock position.

Processing Example of Control Unit

A processing example of the control unit 1a will be described. If the opening portion 2a of the port plate 2 is unnecessarily opened, a working space S is exposed to the outside, and, for example, the end effector 60 of the substrate conveying robot 6 undesirably projects to the outside. As of the port door 41 as well, if the port door 41 is exposed to the outside during movement of the port door 41, a foreign object is undesirably caught between the port plate 2 and the port door 41.

Figure 10A:
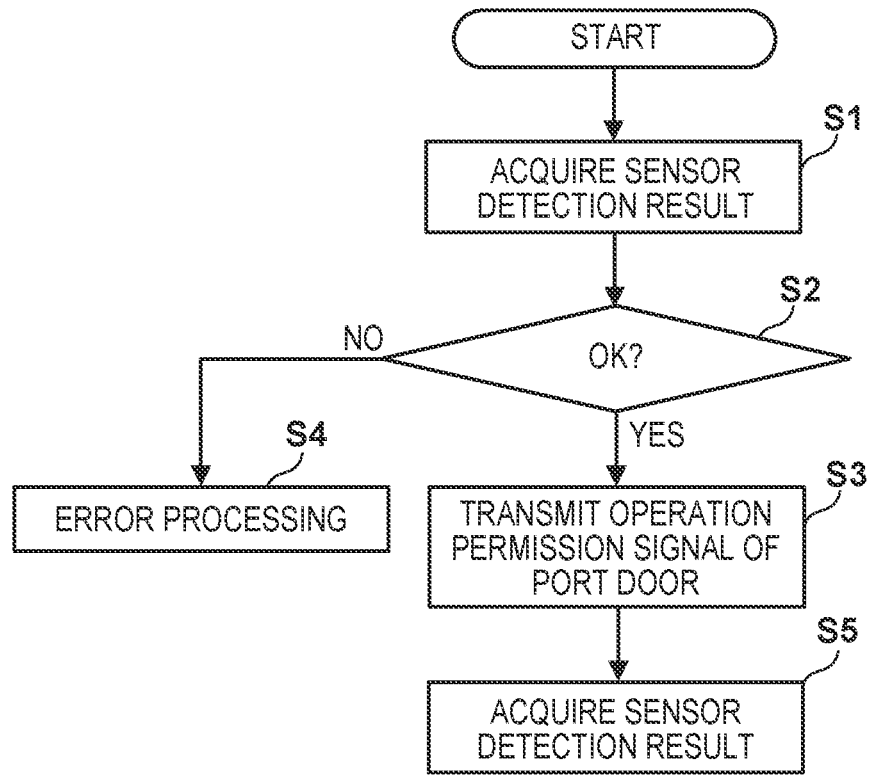
FIGS. 10A and 10B are flowcharts showing a processing example of a control unit.
Figure 10B:
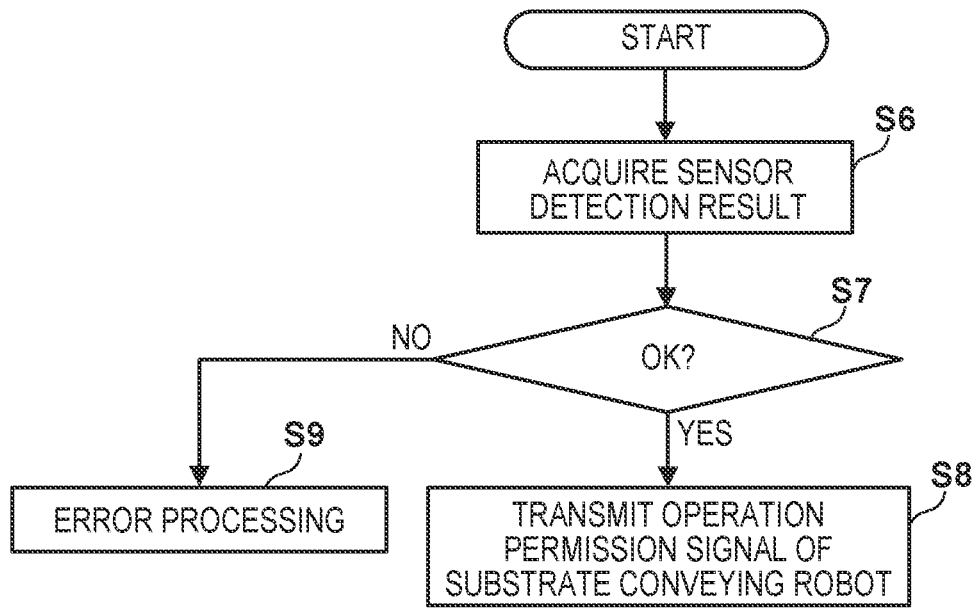

In this embodiment, the port door 41 is moved at least on condition that the container 5 is appropriately present on the dock plate 30, and the dock plate 30 is located at the dock position. Accordingly, even if the opening portion 2a is opened, the container 5 exists in front of the opening portion 2a and closes it. This can prevent the port door 41 and the working space S from being exposed to the outside. FIGS. 10A and 10B are flowcharts showing a processing example of the control unit 1a.

The processing example shown in FIG. 10A is executed when, for example, performing an opening operation of the port door 41 in a state in which the container 5 is placed on the dock plate 30. An instruction of the opening operation is transmitted from, for example, the host computer to the control unit 1a via the communication line 1b.

In step S1, the detection result of a predetermined sensor in the sensor group 1c is acquired. The predetermined sensor includes at least the sensors 10a, 11a, and 90. In step S2, it is determined whether the detection result acquired in step S1 is a predetermined detection result. Here, that the detection result is a predetermined detection result means a condition that at least all the sensors 10a, 11a, and 90 are on, that is, the container 5 is appropriately present on the dock plate 30, and the dock plate 30 has moved from the transfer position to the dock position. If the detection result is a predetermined detection result in step S2, the process advances to step S3. If the detection result is not a predetermined detection result, the process advances to step S4.

In step S4, error processing is performed. Here, for example, a notification representing that the operation condition is not satisfied is transmitted to the host computer via the communication line 1b. Alternatively, the operator is notified of a warning by a voice or display.

In step S3, an operation permission signal of the port door 41 is transmitted to the control unit 1a. Accordingly, the port door 41 is caused to hold the lid 51 and moved to the open position. Since it is confirmed in step S2 that the container 5 is appropriately present on the dock plate 30, and the opening portion 2a is closed at the dock position, the port door 41 and the working space S during the operation are not exposed to the outside. That is, since the opening portion 2a is closed by the container 5, the working space S is not exposed to the outside via the opening portion 2a.

In step S5, the detection result of a predetermined sensor in the sensor group 1c is acquired. This mainly aims at operation confirmation. The predetermined sensor includes at least a sensor that detects whether the port door 41 has moved to the open position. The detection results of the sensors 10a, 11a, and 90 may be included again, although these are included in the detection result acquisition target in step S1.

The processing example shown in FIG. 10A is also applied when performing a closing operation of the port door 41 in a state in which the container 5 is placed on the dock plate 30. An instruction of the closing operation is transmitted from, for example, the host computer to the control unit 1a via the communication line 1b.

In step S1, the detection result of a predetermined sensor in the sensor group 1c is acquired. The predetermined sensor includes at least the sensors 10a, 11a, and 90. In step S2, it is determined whether the detection result acquired in step S1 is a predetermined detection result. Here, that the detection result is a predetermined detection result means a condition that at least all the sensors 10a, 11a, and 90 are on, that is, the container 5 is appropriately present on the dock plate 30, and the dock plate 30 has moved from the transfer position to the dock position. If the detection result is a predetermined detection result in step S2, the process advances to step S3. If the detection result is not a predetermined detection result, the process advances to step S4.

In step S3, an operation permission signal of the port door 41 is transmitted to the control unit 1a. Accordingly, the port door 41 is moved to the close position. Since it is confirmed in step S2 that the container 5 is appropriately present on the dock plate 30, and the opening portion 2a is closed at the dock position, the port door 41 and the working space S during the operation are not exposed to the outside. That is, since the opening portion 2a is closed by the container 5, the port door 41 is prevented from catching a foreign object.

In step S5, the detection result of a predetermined sensor in the sensor group 1c is acquired. The predetermined sensor includes at least a sensor that detects whether the port door 41 has moved to the close position. The detection results of the sensors 10a, 11a, and 90 may be included again, although these are included in the detection result acquisition target in step S1.

The processing example shown in FIG. 10B is executed when, for example, performing an operation of the substrate conveying robot 6 in a state in which the container 5 is placed on the dock plate 30. An instruction of the operation is transmitted from, for example, the host computer to the control unit of the substrate conveying robot 6.

In step S6, the detection result of a predetermined sensor in the sensor group 1c is acquired. The predetermined sensor includes at least the sensors 10a, 11a, and 90. In step S7, it is determined whether the detection result acquired in step S6 is a predetermined detection result. If the detection result is a predetermined detection result, the process advances to step S8. If the detection result is not a predetermined detection result, the process advances to step S9. In step S9, error processing is performed. This is the same processing as in step S4.

In step S8, an operation permission signal of the substrate conveying robot 6 is transmitted to the control unit of the substrate conveying robot 6 or the host computer via the communication line 1b. Accordingly, the operation of the substrate conveying robot 6 is started. Since the operation of the substrate conveying robot 6 is permitted at least only in a state in which the opening portion 2a is closed by the container 5, safety on the periphery can be ensured.

Note that even if the container 5 is not placed, the operation permission signal of the substrate conveying robot 6 may be transmitted if the port door 41 is located at the close position. In this embodiment, if it is detected that the container 5 is not placed in a state in which the port door 41 is located at the open position due to some reason, error processing may be performed to inhibit the operation of the substrate conveying robot 6.

Second Embodiment

In the first embodiment, in the state shown in FIG. 9B, the detection unit 9 is arranged such that the detection pin 32R that is not pushed down abuts against the roller portion 91a. However, the detection unit 9 may be arranged so the detection pin 32R does not abut. FIGS. 11A to 11D are explanatory views of the operations of a detection pin 32R and a detection unit 9, which show an example.

Figure 11A:
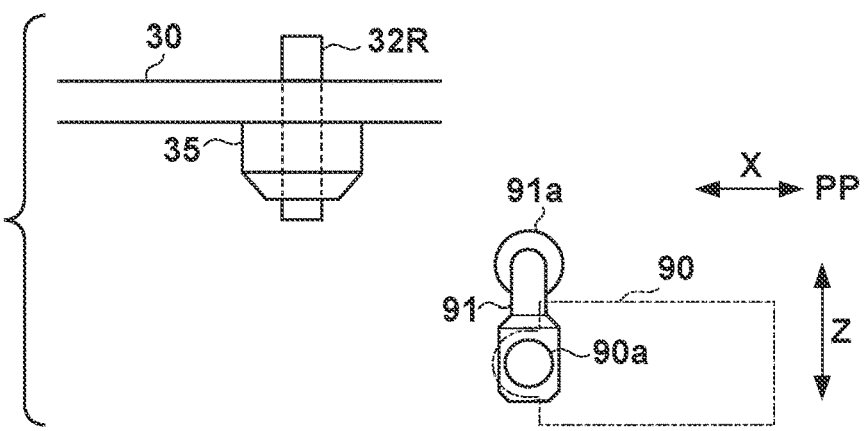
FIGS. 11A to 11D are explanatory views of the operation of the detection unit shown in FIG. 8A in another use example.
Figure 11B:
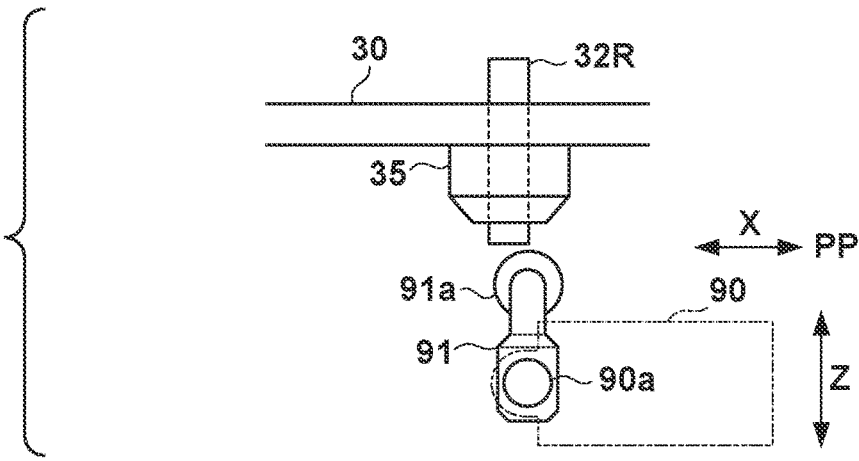

FIG. 11A shows a state in which a dock plate 30 is located at the transfer position. A container 5 is not placed on the dock plate 30, and the detection pin 32R is located at the initial position by the biasing of an elastic member 35b described above. A movable member 91 is located at the initial position. FIG. 11B shows a state in which the dock plate 30 has moved from the state in FIG. 11A to the dock position. The container 5 is not placed on the dock plate 30, and the detection pin 32R is still located at the initial position by the biasing of the above-described elastic member 35b. The detection pin 32R does not abut against a roller portion 91a, and the movable member 91 is still located at the initial position. At this time, a sensor 90 is not turned on and remains off.

Figure 11C:
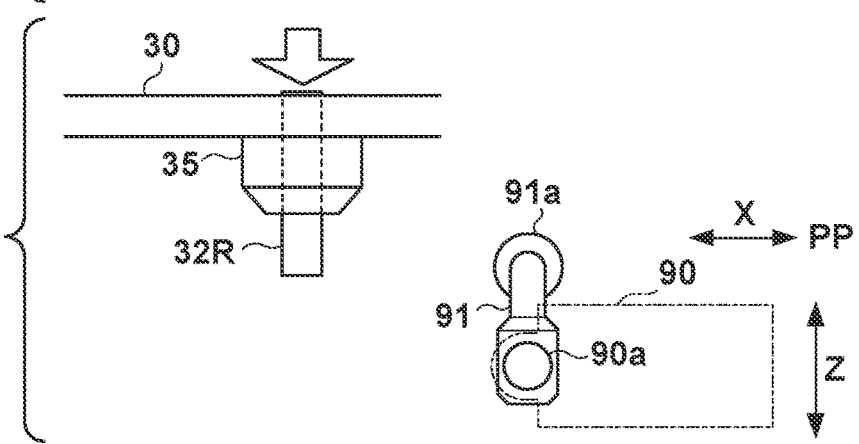
Figure 11D:
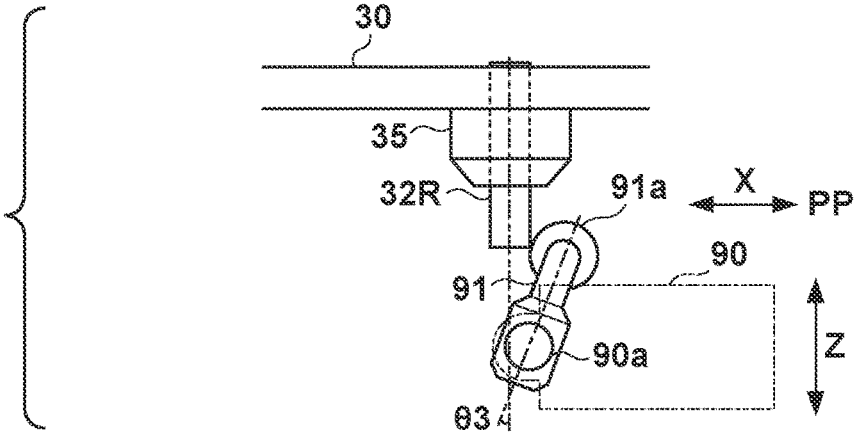

FIG. 11C shows a state in which the dock plate 30 is located at the transfer position. FIG. 11C assumes a state in which the container 5 is placed on the dock plate 30. The detection pin 32R is pushed down by the weight of the container 5, and the projecting amount downward from a support portion 35 is large. FIG. 11D shows a state in which the dock plate 30 has moved from the state in FIG. 11C to the dock position. When the detection pin 32R deeply abuts against the roller portion 91a, the movable member 91 tilts from the initial position to the PP side in the X direction by a tilt angle θ3 (~θ2). At this time, the sensor 90 of the movable member 91 is turned on.

Third Embodiment

In the first embodiment, a rotary limit switch is used as the sensor 90. However, a linear motion limit switch may be used. FIGS. 12A to 12D are explanatory views of an operation, which show an example. In the example shown in FIGS. 12A to 12D, a sensor 12 is used in place of the sensor 90. The sensor 12 is a linear motion limit switch configured to detect an X-direction displacement of a plunger 12a that is a movable member.

Figure 12A:
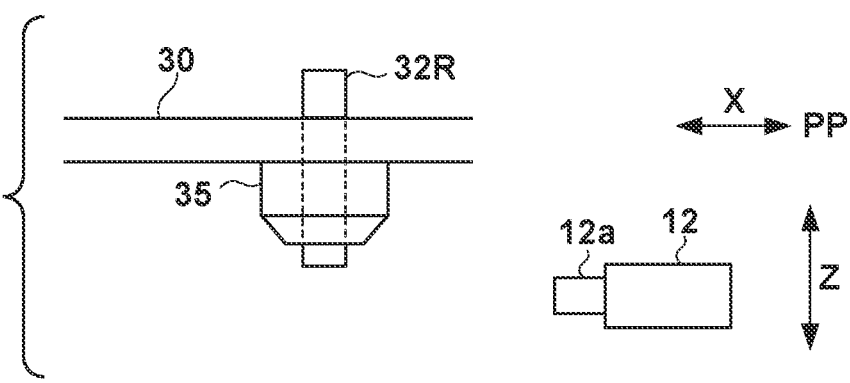
FIGS. 12A to 12D are explanatory views of the operation of a detection unit of another example.
Figure 12B:
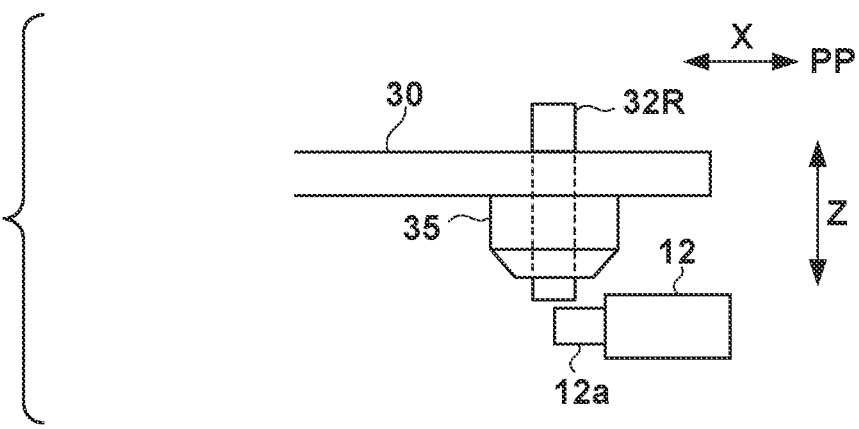

FIG. 12A shows a state in which a dock plate 30 is located at the transfer position. A container 5 is not placed on the dock plate 30, and a detection pin 32R is located at the initial position by the biasing of an elastic member 35b described above. The plunger 12a is located at the initial position. FIG. 12B shows a state in which the dock plate 30 has moved from the state in FIG. 12A to the dock position. The container 5 is not placed on the dock plate 30, and the detection pin 32R is still located at the initial position by the biasing of the above-described elastic member 35b. The detection pin 32R does not abut against the plunger 12a because of a shift in the Z direction, and the plunger 12a is still located at the initial position. The sensor 12 is not turned on.

Figure 12C:
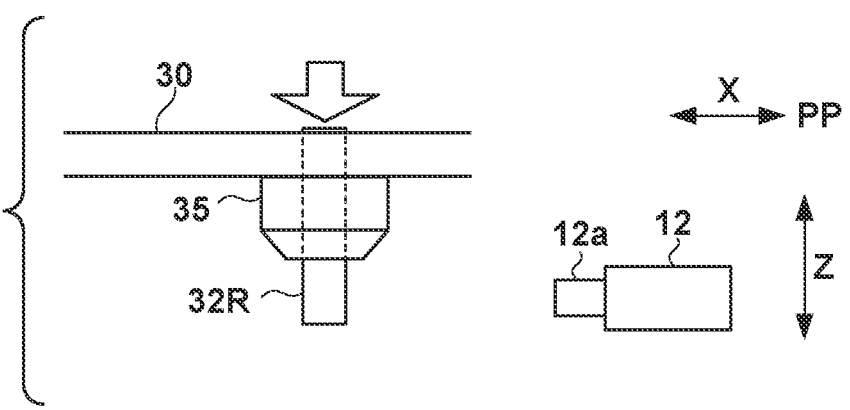
Figure 12D:
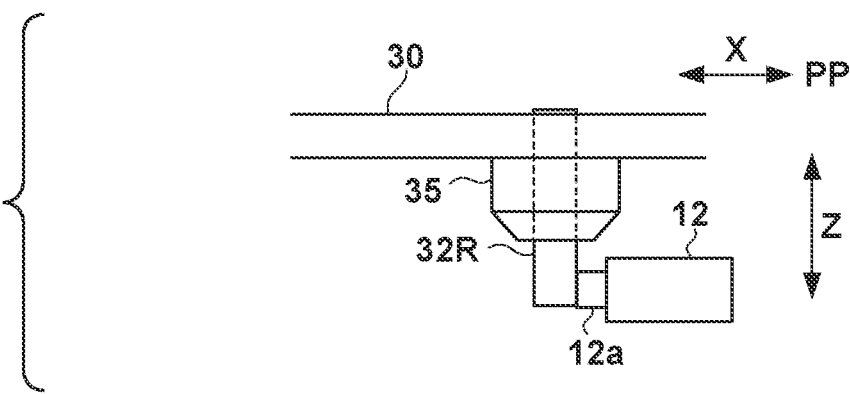

FIG. 12C shows a state in which the dock plate 30 is located at the transfer position. FIG. 12C assumes a state in which the container 5 is placed on the dock plate 30. The detection pin 32R is pushed down by the weight of the container 5, and the projecting amount downward from a support portion 35 is large. FIG. 12D shows a state in which the dock plate 30 has moved from the state in FIG. 12C to the dock position. When the detection pin 32R abuts against the plunger 12a, the plunger 12a displaces from the initial position to the side of a port plate 2 in the X direction. The sensor 12 is turned on to detect that the container 5 is placed on the dock plate 30, and the dock plate 30 is located at the dock position.

Fourth Embodiment

Figure 13:
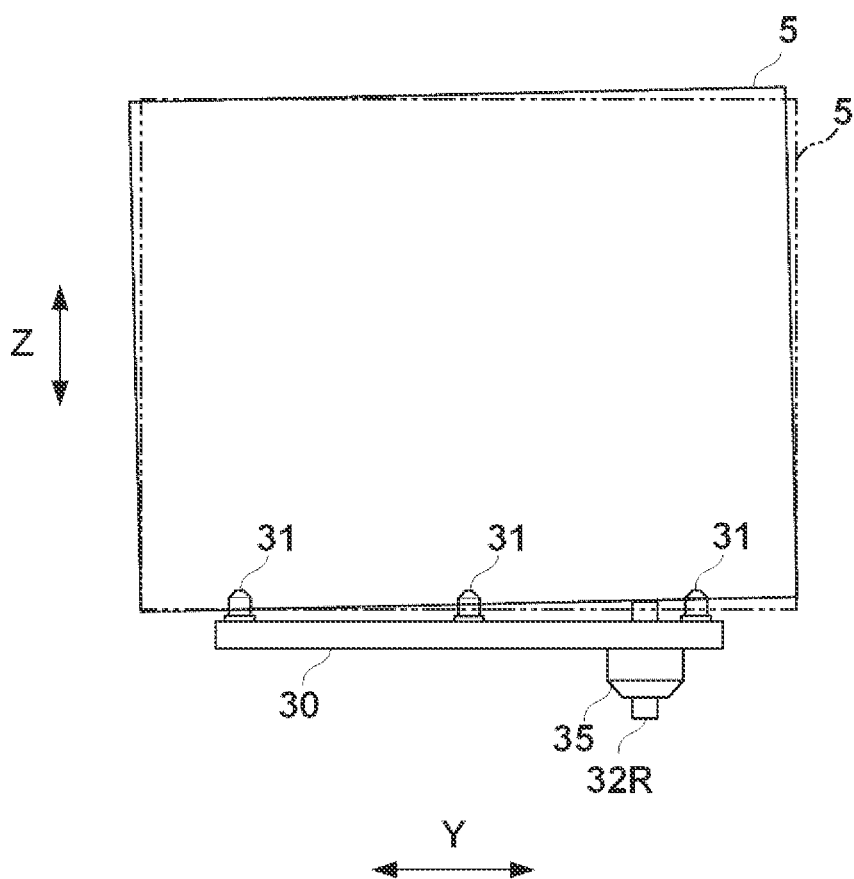
FIG. 13 is a view showing an example in which a container is placed in a tilting state.

As described in the first embodiment, if the container 5 is placed in a tilting state on the dock plate 30, at least one of the detection pins 32F, 32L, and 32R is not pushed down. Hence, such an inappropriate placement state is detected. However, if the tilt of the container 5 is small, for example, the detection pin 32R may be pushed down to some extent. FIG. 13 shows an example. Referring to FIG. 13, a container 5 indicated by a two-dot chain line shows an example of the container 5 appropriately placed on a dock plate 30, and the container 5 indicated by a solid line shows an example of the container 5 placed while tilting in the Y direction (in FIG. 13, the left side is down, and the right side is up).

Figure 14:
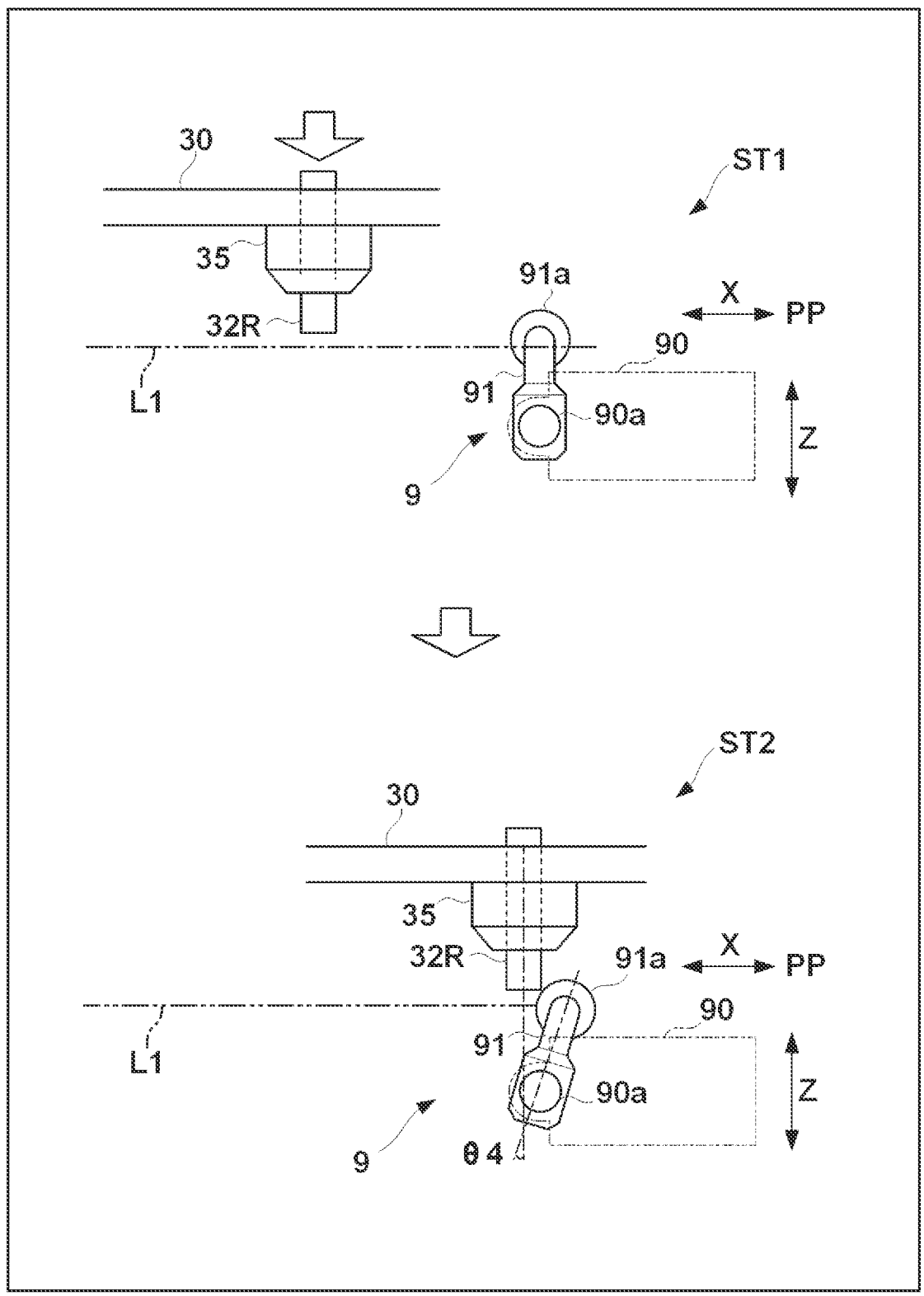
FIG. 14 is a view showing an example of detection of the detection unit in a case in which the container is placed in a tilting state.

FIG. 14 shows the behavior of a detection unit 9 in a case in which the container 5 is placed while tilting in the Y direction, as shown in FIG. 13, and a detection pin 32R is pushed down. A two-dot chain line L1 indicates the trajectory of the position of the lower end of the detection pin 32R in a case in which the container 5 is appropriately placed on the dock plate 30.

A state ST1 shows a state in which the dock plate 30 is located at the transfer position. The container 5 (not shown)

is placed in a tilting state on the dock plate 30, and the lower end of the pin 32R does not reach the lower end position L1.

A state ST2 shows a state in which the dock plate 30 has moved from the state ST1 to the dock position. When the detection pin 32R abuts against a roller portion 91a, a movable member 91 tilts from the initial position to the side of a port plate 2 in the X direction only by a tilt angle θ4.

When the tilt of the container 5 is within an allowable range, there is no problem in the transferring of the substrate W. However, if the tilt of the container 5 is over the allowable range, a problem such that the end effector 60 of the substrate conveying robot 6 cannot adequately transfer the substrate W may occurs. Hence, it is preferable to discriminate a tilt of the container 5 which allows the transferring of the substrate W. For example, if the tilt angle of the movable member 91 is θ4 (<θ2), a sensor 90 does not generate an ON signal. However, depending on the individual difference or attachment error of the detection unit 9, for each load port 1, the push-down amount of the detection pin 32R and the tilt angle of the movable member 91 at which the sensor 90 is turned on do not have a predetermined relationship in some cases.

Hence, a position adjustment mechanism for the detection unit 9 may be provided. When the position of the detection unit 9 can be adjusted for each load port 1, the push-down amount of the detection pin 32R and the tilt angle of the movable member 91 at which the sensor 90 is turned on can be adjusted to predetermined values, and it is possible to reliably detect that the container 5 in a posture over an unallowable tilt range is placed on the dock plate 30.

Figure 15:
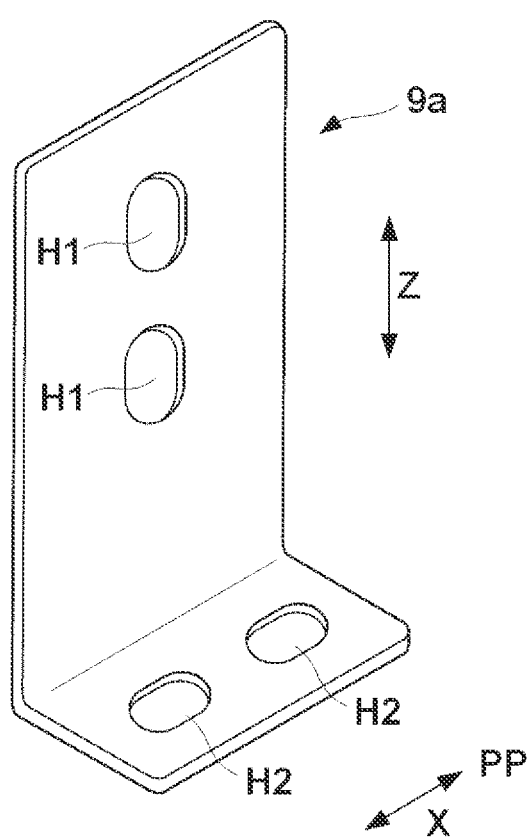
FIG. 15 is a perspective view of a position adjusting bracket.

The position adjustment mechanism can be any mechanism. As an example, a structure in which a bracket 9a has an attachment position adjustment function is simple. FIG. 15 is a perspective view of the bracket 9a having a position adjustment function.

The bracket 9a is an L-shaped metal fitting, and includes attachment holes H1 used to attach the detection unit 9 to the bracket 9a, and attachment holes H2 used to attach the bracket 9a to a base portion 7. In the detection unit 9, screw holes (not shown) are formed in the case of the sensor 90. When screws are inserted into the attachment holes H1 and fastened to the screw holes, the detection unit 9 is fixed to the bracket 9a. Screw holes (not shown) are formed in the base portion 7 as well. When screws are fastened to the screw holes via the attachment holes H2, the bracket 9a is fixed to the base portion 7.

The attachment holes H1 are long holes extending in the Z direction. Hence, the attachment position of the detection unit 9 in the Z direction with respect to the bracket 9a can be adjusted. The attachment holes H2 are long holes extending in the X direction. Hence, the attachment position of the bracket 9a in the X direction with respect to the base portion 7 can be adjusted. It is therefore possible to adjust the position of the detection unit 9 in the Z and X directions with respect to the detection pin 32R.

When adjusting the position of the detection unit 9, the detection unit 9 is temporarily fixed to the base portion 7 via the bracket 9a. Intentionally as a test, the container 5 in a posture over an unallowable tilt range is placed on the dock plate 30, and the output of the sensor 90 when the dock plate 30 is moved from the transfer position to the dock position is monitored. If the sensor 90 outputs an ON signal, the position of the detection unit 9 is not appropriate. Hence, for example, the position of the detection unit 9 in the X direction is adjusted to the PP side. Alternatively, the position of the detection unit 9 in the Z direction is lowered.

In addition, as a test, the container 5 in a normal posture within the allowable tilt range is placed on the dock plate 30, and the output of the sensor 90 when the dock plate 30 is moved from the transfer position to the dock position is monitored. If the sensor 90 does not output an ON signal, the position of the detection unit 9 is not appropriate. Hence, for example, the position of the detection unit 9 in the X direction is adjusted to the side opposite to the PP side. Alternatively, the position of the detection unit 9 in the Z direction is raised. The position of the detection unit 9 can thus appropriately be adjusted, and a state in which the container 5 is placed in an inappropriate posture can be detected more reliably.

Fifth Embodiment

Figure 16:
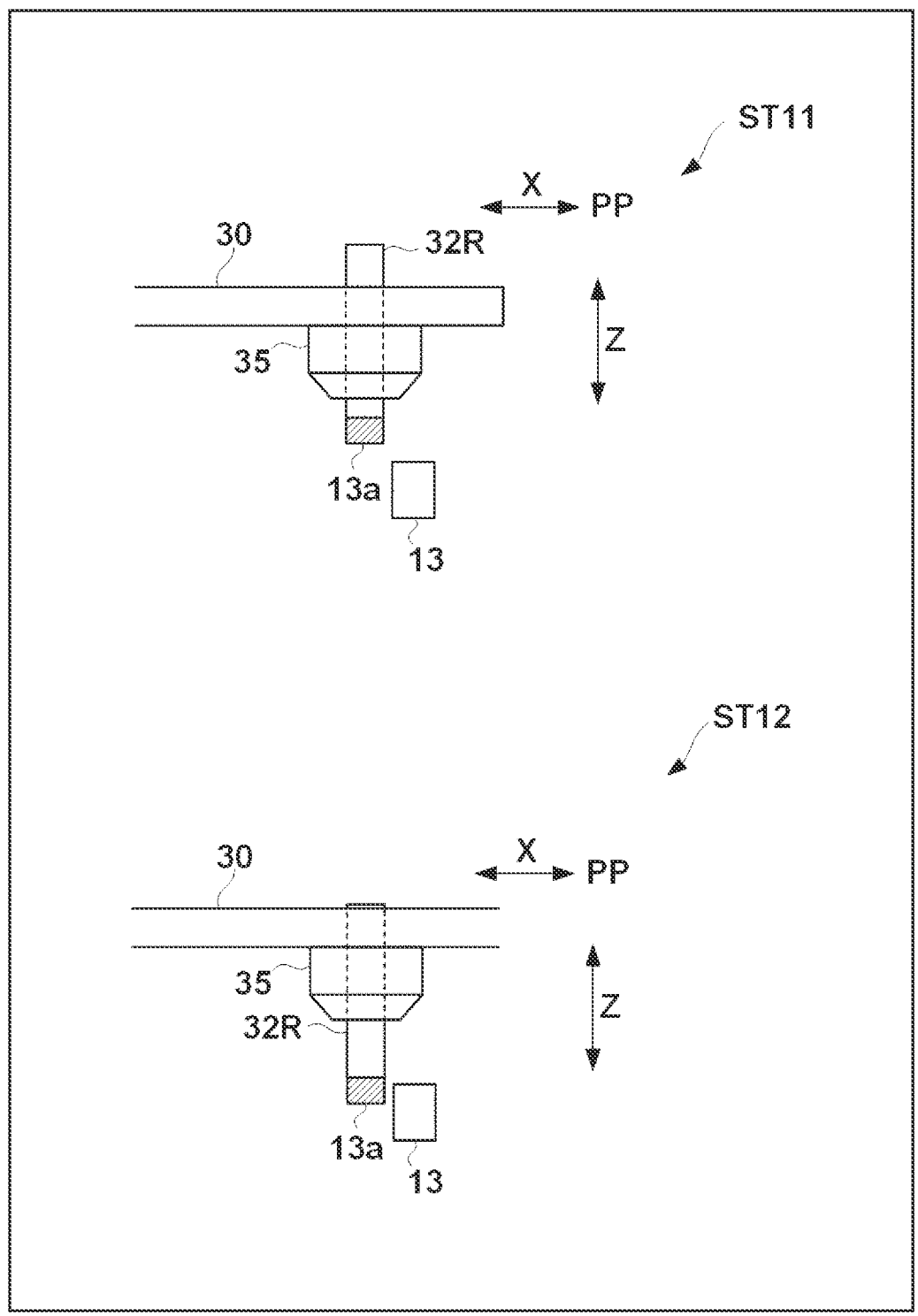
FIG. 16 is an explanatory view of another example of the detection unit.

In the above-described embodiments, as the detection unit 9, a contact-type detection unit that contacts the detection pin 32R is employed. However, a noncontact-type detection unit can also be employed. FIG. 16 shows a noncontact-type detection unit 13 that replaces the detection unit 9.

The detection unit 13 is a non-contact sensor such as a proximity sensor that detects the proximity of a detection target 13a, and is, for example, a magnetic type proximity sensor, an electrostatic capacitance type proximity sensor, or an electromagnetic induction type proximity sensor. Although the detection target 13a is integrally provided at the lower end portion of a detection pin 32R, preferably, the detection target 13a is integrally provided with the detection pin 32R and is made of the same metal, such as an iron or aluminum, as the detection pin 32R, or only the detection target 13a is made of a magnet according to the type of the proximity sensor as follows.

The magnetic type proximity sensor is constructed from a reed switch, a hall element or a magnetoresistive element. When the magnetic type proximity sensor constructed from the reed switch is used, the detection target 13a is made of a magnet and the proximity of the detection target 13a is detected by a physical operation of the reed switch due to magnetic attraction. When the magnetic type proximity sensor constructed from the hall elements or the magnetoresistive element, the proximity of the detection target 13a of a magnet is detected based on a change of magnetic field or magnetic flux.

The electrostatic capacitance type proximity sensor includes a detection electrode and an oscillating circuit as a circuit which detects a change of capacitance of the detection electrode. The oscillating circuit can detect the proximity of the detection target 13a of a metal by the change of capacitance of the detection electrode since the capacitance of the detection electrode changes when the detection target 13a closes to the circuit.

The electromagnetic induction type proximity sensor includes a detection coil which generates an alternating magnetic field. When the detection target 13a of a metal conductor closes to the alternating magnetic field, an eddy current generates in the metal conductor so as to damp or stop an oscillation of a oscillating circuit in the sensor, thereby the detection target 13a which closes to the electromagnetic induction type proximity sensor is detected.

A state ST11 shows a case in which a dock plate 30 has moved to the dock position in a state in which a container 5 is not placed on the dock plate 30 (a state in which the detection pin 32R is not pushed down). Since the detection target 13a and the detection unit 13 are apart in the Z direction, the detection target 13*a* is not detected by the detection unit 13. Hence, it is determined that the container 5 is not appropriately placed.

A state ST12 shows a case in which the dock plate 30 has moved to the dock position in a state in which the container 5 is appropriately placed on the dock plate 30 (a state in which the detection pin 32R is pushed down). Since the detection target 13*a* and the detection unit 13 are adjacent, the detection target 13*a* is detected by the detection unit 13. Hence, it is determined that the container 5 is appropriately placed.

If the detection unit 13 is a sensor that outputs a detection signal according to the degree of proximity of the detection target 13*a*, a state described in the fourth embodiment in which the container 5 is placed while tilting in the Y direction, and the detection pin 32R is insufficiently pushed down can also be detected.

Figure 17:
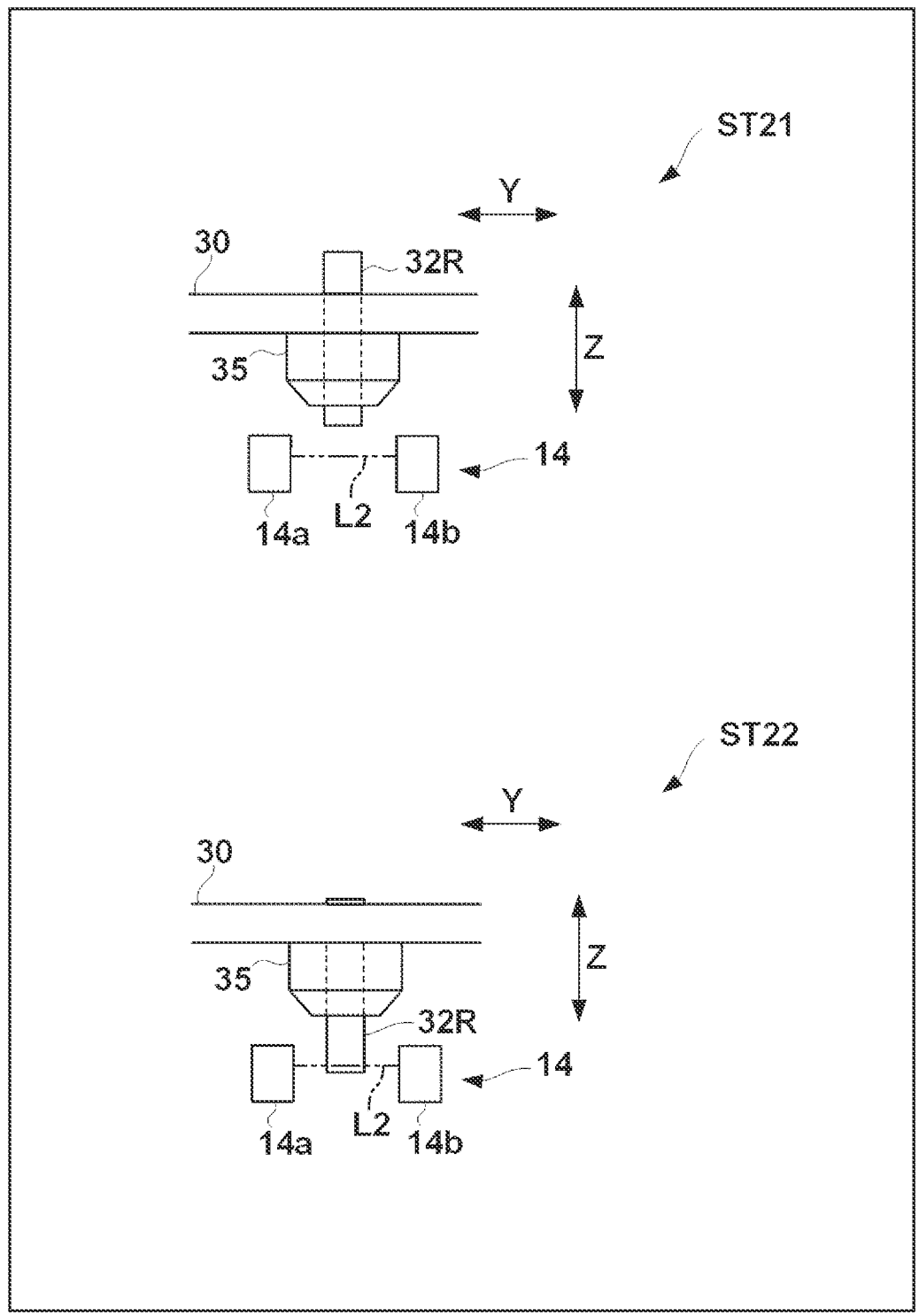
FIG. 17 is an explanatory view of still another example of the detection unit.

FIG. 17 shows another noncontact-type detection unit 14 that replaces the detection unit 9. FIG. 17 is a view of a sight line direction different from FIG. 16. FIG. 17 shows the periphery of the detection pin 32R from a sight line in the X direction. The detection unit 14 is an optical sensor including a light-emitting element 14*a* and a light-receiving element 14*b*, and is, for example, a photo interrupter. A two-dot chain line L2 indicates an orbit of light from the light-emitting element 14*a*.

A state ST21 shows a case in which the dock plate 30 has moved to the dock position in a state in which the container 5 is not placed on the dock plate 30 (a state in which the detection pin 32R is not pushed down). Since the detection pin 32R does not block the orbit of light L2, the detection pin 32R is not detected by the detection unit 14. Hence, it is determined that the container 5 is not appropriately placed.

A state ST22 shows a case in which the dock plate 30 has moved to the dock position in a state in which the container 5 is appropriately placed on the dock plate 30 (a state in which the detection pin 32R is pushed down). Since the detection pin 32R blocks the orbit of light L2, the detection pin 32R is detected by the detection unit 14. Hence, it is determined that the container 5 is appropriately placed.

If the detection unit 14 is a sensor that outputs a detection signal according to the degree of blocking of the orbit of light L2 by the detection pin 32R (the degree of the light reception amount of the light-receiving element 14*b*), a state described in the fourth embodiment in which the container 5 is placed while tilting in the Y direction, and the detection pin 32R is insufficiently pushed down can also be detected.

The invention is not limited to the foregoing embodiments, and various variations/changes are possible within the spirit of the invention.

What is claimed is:

1. A load port comprising:
a port plate including an opening portion through which it is configured to take in and out a substrate;
a placing table on which a container that stores the substrate is placed;
a port door capable of opening/closing the opening portion and holding a door portion of the container; and
a driving mechanism configured to perform an opening/closing operation of the port door,
wherein the placing table comprises:
a base portion;
a dock plate on which the container is placed;
a moving mechanism provided on the base portion and configured to support the dock plate and move the dock plate between a first position close to a side of the port plate where the port door configured to hold the door portion and a second position apart from the port plate;
a first pin projecting on the dock plate and provided on the dock plate so as to be pushed down; and
a first detection unit provided on the base portion and configured to detect that the dock plate is located at the first position, the first detection unit comprises:
a movable member configured to be displaced, with respect to the base portion, in a moving direction of the dock plate by the moving mechanism; and a first sensor configured to detect the displacement of the movable member, and
the movable member is arranged at a position to abut against the first pin that is in a pushed down state in a process in which the dock plate moves from the second position to the first position.

2. The load port according to claim 1, further comprising a control unit configured to determine, based on a detection result of the first sensor, whether the dock plate has reached the first position, and drive the driving mechanism when, as one condition, it is determined that the dock plate has reached the first position.

3. The load port according to claim 1, further comprising:
a second detection unit configured to detect whether the container is placed on the dock plate; and
a third detection unit configured to detect whether the container is placed on the dock plate,
wherein the second detection unit comprises:
a second pin projecting on the dock plate and provided on the dock plate so as to be pushed down; and
a second senor supported on the dock plate and configured to detect that the second pin has been pushed down, and
the third detection unit comprises:
a third pin projecting on the dock plate and provided on the dock plate so as to be pushed down; and
a third senor supported on the dock plate and configured to detect that the third pin has been pushed.

4. The load port according to claim 3, wherein
two pins of the first to third pins are arranged on a side of the port plate in the moving direction while being apart in a direction crossing the moving direction,
a remaining pin other than the two pins is arranged at a position farther from the port plate in the moving direction than the two pins, and
the first to third pins are arranged to be located at vertices of an acute triangle in a planar view of the dock plate.

5. The load port according to claim 4, wherein the first pin is one of the two pins.

6. The load port according to claim 3, further comprising a control unit configured to determine, based on a detection result of the first sensor, whether the dock plate has reached the first position, and drive the driving mechanism at least on condition that it is determined that the dock plate has reached the first position,
wherein the control unit starts the opening/closing operation of the port door by the driving mechanism
when the second sensor detects push-down of the second pin,
the third sensor detects push-down of the third pin, and
the first sensor detects that the dock plate is located at the first position.

7. The load port according to claim 3, further comprising a control unit configured to determine, based on a detection result of the first sensor, whether the dock plate has reached the first position, and drive the driving mechanism at least on condition that it is determined that the dock plate has reached the first position, wherein a substrate conveying module is provided on the side of the port plate, and a substrate conveying robot configured to take in or out the substrate between the substrate conveying module and the container via the opening portion is provided in the substrate conveying module, and the control unit transmits a signal for permitting an operation of the substrate conveying robot
when the second sensor detects push-down of the second pin,
the third sensor detects push-down of the third pin, and
the first sensor detects that the dock plate is located at the first position.

* * * * *